United States Patent [19]
Spriester

[11] Patent Number: 5,483,208
[45] Date of Patent: Jan. 9, 1996

[54] RADIO FREQUENCY CHOKE AND TAP

[75] Inventor: Bart F. Spriester, Duluth, Ga.

[73] Assignee: Scientific-Atlanta, Inc., Norcross, Ga.

[21] Appl. No.: 297,724

[22] Filed: Aug. 26, 1994

[51] Int. Cl.$^6$ ............................... H03H 7/01; H03H 7/46
[52] U.S. Cl. ........................ 333/131; 333/132; 333/181; 333/185; 336/224
[58] Field of Search ........................ 333/112, 119, 333/131, 132, 181, 185, 245; 334/72, 75; 336/170, 171, 174, 180, 221, 224

[56] References Cited

U.S. PATENT DOCUMENTS

| | | | |
|---|---|---|---|
| 2,598,810 | 6/1952 | Lyman | 334/75 |
| 3,052,860 | 9/1962 | Walters, III | 336/224 X |
| 3,747,028 | 7/1973 | Pennypacker | 333/112 |
| 4,394,631 | 7/1983 | Pavlic | 333/112 X |
| 4,641,115 | 2/1987 | Bailey | 333/181 |
| 5,032,808 | 7/1991 | Reddy | 333/181 |

FOREIGN PATENT DOCUMENTS

| | | | |
|---|---|---|---|
| 38313 | 12/1970 | Japan | 336/224 |
| 141207 | 8/1984 | Japan | 336/224 |

*Primary Examiner*—Paul Gensler
*Attorney, Agent, or Firm*—Steven C. Stewart; Frederick W. Powers, III

[57] ABSTRACT

An RF Choke and tap having improved insertion loss, amplitude modulated distortion of video and audio carrier signals at CATV frequencies. The RF choke includes a 20 AWG magnetic wire wound on a ferrite rod. The magnetic field effects of the choke are optimized by selecting the choke winding pattern, rod core material and positioning of a resistor between selected windings. The wire is wound by placing two groups of the 4 tightly wound wires adjacent the ends of the rod. A group of 3 very loosely wound wires is separated from the wound wires and placed between the groups of 4 tightly wound wires. A resistor is electrically connected to a first wire in one of the groups of tightly wound wires and connected to a first wire in the group of the loosely wound wires.

17 Claims, 3 Drawing Sheets

COMPARISION OF TAP RF COILS (6 AMPS)

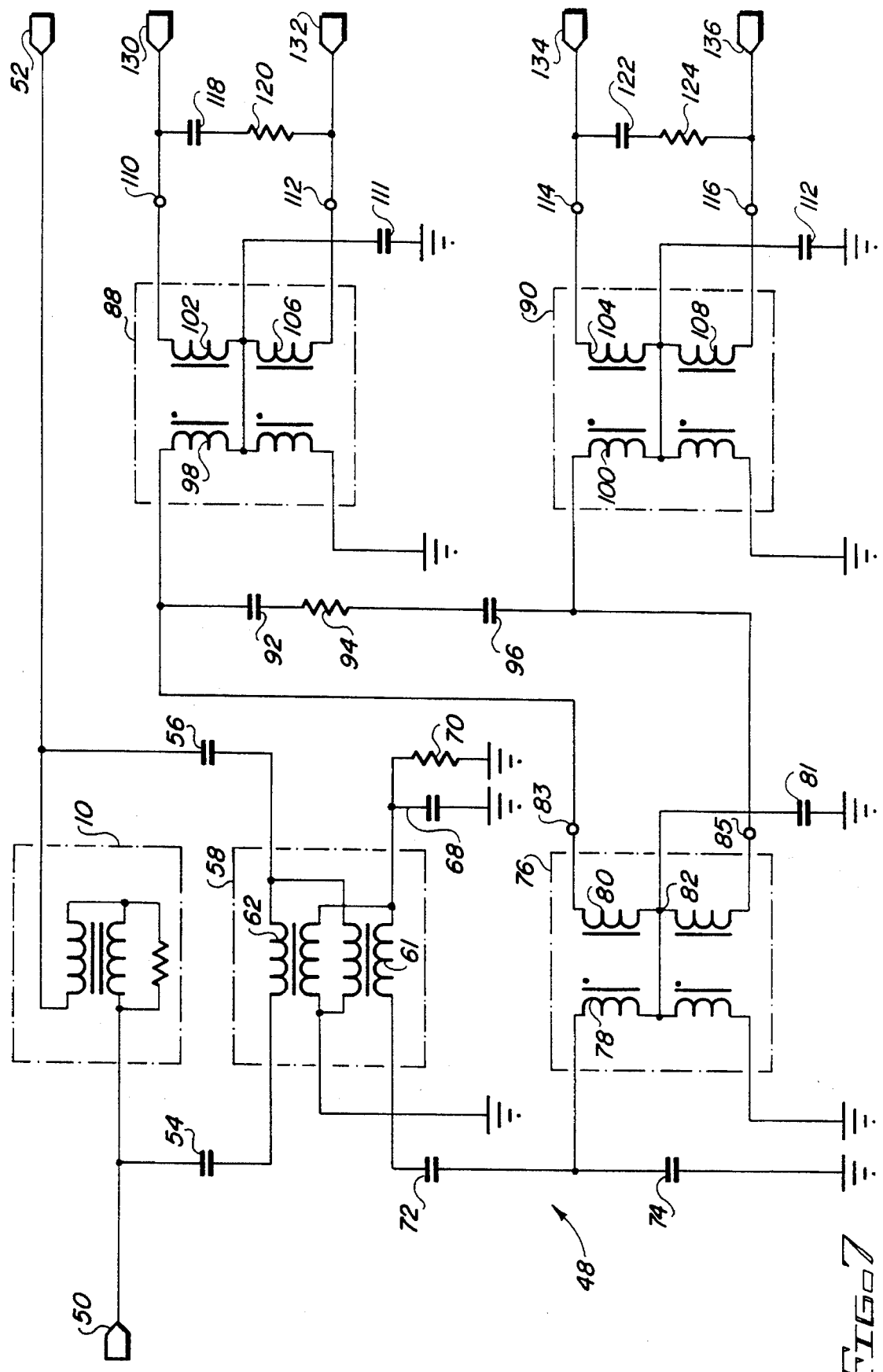

RADIO FREQUENCY CHOKE AND TAP

BACKGROUND OF THE INVENTION

This invention relates to radio frequency taps and chokes, and more particularly to a device for separating a single phase AC power signal from a broadband signal carried on the same conductor that has improved power consumption characteristics.

When distributing radio frequency (RF) signals, such as television signals, over cable, it is common practice to transmit RF signals and single phase AC power signals over the same coaxial cable simultaneously.

These RF signals originate from a central location commonly referred to as the "headend". The media used to carry the RF signals, typically a coaxial cable, inherently has loss characteristics. Thus an amplifier station must be installed at appropriate locations along the cable to compensate for the losses and deliver the RF signal levels as closely as possible to what they were at the headend. The single phase AC power signal, which in the United States is conventionally 60 Hz, is needed to operate the amplifier stations.

The peak power signals are passed along the cable concurrently with the RF signals. The power level of the AC signal is typically 50,000 times greater than that of the RF signal, and uses different and separate circuitry to operate the amplifier station. Therefore, the AC power signal must be separated from the RF signal at each of the amplifier stations.

Other equipment, in addition to the aforementioned stations, is used in cable distribution for distributing RF signals according to subscriber requirements. This other equipment such as passive equipment, do not need the single AC power signals for its operation. The passive equipment, however, must be able to pass and distribute the AC power signal without interfering with the various operations that relate to the RF signals.

In the amplifier stations which must use the single phase AC power signal and in the passive equipment which must pass or distribute the AC power signals, special circuits are employed for separating the RF signals from the AC power signal. Also, the equipment used in the cable system for introducing, or coupling, the single phase AC power signal into the system employs special circuits, similar to the separating circuits mentioned above, which operate to combine the AC power signal and the RF signals. The special circuits will hereinafter be collectively referred to as the frequency duplexing circuits for clarity of this description.

One of the main problems with cable systems results from cascading of the many similar circuits used in the equipment provided along the length of the cable system. Each piece of the various types of equipment will have a characteristic frequency response, and it is desirable that each piece of equipment be capable of maintaining the relative level of all of the RF signals to each other. That is, the relative levels of the RF signals at the output end of each piece of the equipment should ideally be identical with the relative levels at the input end. This is often referred to as a "flat" response and means that the equipment is not contributing unwanted variations in the signal levels regardless of the frequency of the signal. In actuality, circuits do not have perfectly "flat" frequency responses and degradation of the "flat" response becomes a bigger problem at higher frequencies and as the bandwidth of frequencies increases. In equipment of the same make, flatness degradations are usually of the same type and occur at about the same spot in the RF bandwidth. When the equipment is cascaded, the flatness degradations are cumulative and cause what is called a "signature". If the cascade is long and the flatness degradation of a single unit is large enough, the end-of-the-line flatness degradation will be unacceptably high causing severe deterioration of signal quality. Therefore, one of the objectives in equipment design is to keep flatness degradations to a minimum.

The frequency duplexing circuits used in the hereinbefore described cable equipment are by function and necessity in the main RF signal path of the cable system, and radio frequency (RF) chokes are the primary components in these frequency duplexing circuits because all the single phase AC current passes through them and they are connected directly to the RF signal path.

As is well known, an RF choke 36 such as the one shown in FIG. 2, is an inductor which exhibits a high reactance or impedance to signals in the RF frequency range and low impedance to signals of lower frequency. This choke 36 has a plurality of 11 windings of a conductor (20 AWG wire) tightly wound upon a core of ferrite material 14. A resistor, preferably 510 ohms is connected between a first of these windings and winding number 4. In cable systems today, the frequency range of RF signals is from about 5 to 750 MHz. The RF chokes employed as described above in the cable transmission and distribution systems presents a high impedance to those frequencies of the RF signals, and offers virtually no impedance to the lower frequency single phase AC power circuit. This inherent characteristic of RF chokes makes them useful in the separation and combining of RF signals and single phase AC power signals. For example, if such an RF choke were connected with one end tied to the main line carrying both RF signals and AC power signals, and the other end tied to an AC input of a power supply, its function, ideally, would be to provide a low impedance path for the AC power signals to the power supply while presenting a very large impedance to the high frequency radio frequency signals. The result would be that the AC power signal is diverted to the power supply while the RF signals would continue completely unaffected. It should be stated that the separating function described above can only be fully effected by the RF choke in conjunction with other components of the circuit.

Traditional RF chokes, unfortunately, do not offer a uniformly high impedance to all frequencies in the bandwidth of RF signals from 5 to 500 MHz. As is known, most so called traditional RF chokes consists of several turns of insulated wire wound around a ferro-magnetic core. In cable systems, in order to maintain a sufficiently high inductive reactance, or impedance at the 5 MHz end of the frequency band, the RF chokes must have a relatively large number of turns of wire. Due to the physical configuration of these RF chokes, parasitic capacitances exist between the windings of the coil. These capacitances in conjunction with the inductance of the coil form parasitic resonances, most of which are series resonances. The presence of series resonances, along portions of the RF choke, cause significant reductions in its impedance at the resonant frequencies. The Q of these resonant circuits is high enough to cause significant and oftentimes sharp degradations in equipment flatness, and the RF signals are undesirably affected thereby.

Traditional chokes of the type described briefly above can perform well in cable systems having an upper frequency limit of approximately 500 MHz. However, increasing usage of such cable systems results in the need for wider bandwidths and these traditional RF chokes simply do not perform well at higher frequencies.

In addition to the effects on frequency response, the RF chokes used in the equipment of the cable system must be capable of passing several amperes of AC current. The wire used for the coil must therefore be large enough to carry relatively high currents, usually up to about 14 amperes in such cable transmission systems, without becoming excessively warm. Unfortunately, the larger the wire size the more troublesome is the parasitic resonance problem. High currents also pose problems in that core materials are likely to approach saturation thereby presenting the RF signals with an impedance which varies at the frequency rate of the single phase AC power signal. The effect of this is the unwanted modulation of RF signals and this problem is commonly referred to as "hum mod".

The above described problems due to high AC current can be effectively reduced by careful selection of wire size, core material, and core geometry. Many RF chokes have been used to give good performance to the 5 MHz to 450 MHz frequency range. However, when these chokes are used for the 5 MHz to 1,000 MHz frequency range, these chokes have the drawback that they have a moderate amount of insertion loss at frequencies above 750 MHz. These insertion losses cascaded over many circuits results in substantial RF distortion. Further, it is desirable to maximize the reduction of insertion losses as many chokes are cascaded over large networks. Thus, savings of even the smallest amount of insertion loss manifests into a substantial amount of power savings over a large network.

Cable system capabilities are needed for extended bandwidths and upper frequency limits beyond 750 MHz to 1 GHz and higher. Therefore, a need exists for an improved RF choke which overcomes some of the problems and shortcomings of the prior art.

SUMMARY OF THE INVENTION

In accordance with the present invention an improved RF choke and tap is disclosed for use in cable and telephony systems over which RF signals and AC signals are transmitted and distributed. The RF chokes are used in circuits in which the AC signals are separated from the RF signals. The RF chokes have been proven to reduce hum mod and insertion loss for signals in the frequency range of from 5 MHz to about 1 GHz and in some instance even higher.

An object of this invention is to provide an improved RF choke and tap.

Another object of this invention is to separate RF signals from AC signals on a cable network using a choke having reduced insertion loss, and reduced hum mod at radio frequencies.

It is a further object of the invention to reduce the insertion loss of a RF choke to save substantial amount of power lost when circuits incorporating the RF choke are cascaded in a large network.

These and other objects of the invention are provided with a first embodiment with a Radio Frequency choke having an elongated core material and a conductor. The conductor is wound upon said core material and has a first lead and a second lead. The conductor also has a first, second and third successive winding group disposed between said first and said second lead. Each winding group has at plurality of windings wound on said core material in series with one another. The first winding group has the same number of windings as the third winding group. The winding groups have a spacing between a last turn of one winding group and a first turn of an adjacent winding group. Preferably a resistor is connected between said first lead and the first turn of said second winding group.

In the second embodiment an RF tap is provided having an input terminal, an output terminal and a plurality of tap terminals, wherein the tap is operative to pass from the input terminal to the output terminal an RF signal and a AC power signal carried on a same conductor, and wherein the tap couples the RF signal to the tap terminals. The tap comprises a coupler having a primary winding and a secondary winding wherein signals fed to the primary winding are coupled to the secondary winding. The primary winding is capacitively coupled to the input and output terminal and operative to pass the RF portion of the signal from the input to the output terminal. A splitter is provided having a primary winding capacitively coupled to the coupler secondary winding and having a secondary winding coupled to the tap terminals wherein signals fed to the splitter primary winding are coupled to the splitter secondary winding. A radio frequency choke coupled to said input and output terminal in parallel with the coupler. The choke is operative to pass the AC power signal and prevent the passages of the RF signal between the input and output terminal. The choke comprises an elongated core of ferrite material, and a conductor wound upon said core material and having a first lead connected to the input terminal and a second lead connected to the output terminal. The conductor has at first, second and third successive winding group disposed between the first and the second lead. Each winding group has a plurality of windings wound on said core material in series with one another. The first and third winding group each having windings touching each other and said second winding group having windings spaced apart from each other. The winding groups have a spacing between a last turn of one winding group and a first turn of an adjacent winding group. A resistor is connected between the first lead and the first turn of the second winding group.

The foregoing and other objects of the present invention a well as the invention itself, may be more fully understood from the following description when read in conjunction with the accompanying drawings.

BRIEF DESCRIPTION OF THE DRAWINGS

FIG. 7 is a schematic diagram of a tap incorporating the RF choke shown in FIG. 1.

DETAILED DESCRIPTION OF THE PREFERRED EMBODIMENT

Figure 1:
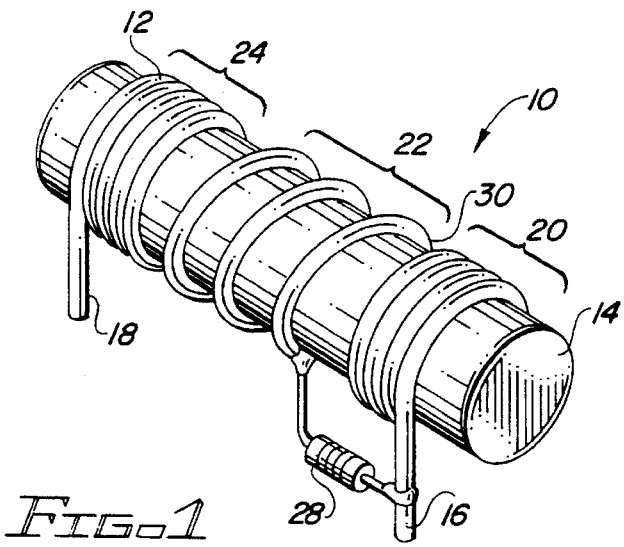
FIG. 1 is a perspective view of the RF choke in accordance with the invention.
Figure 3:
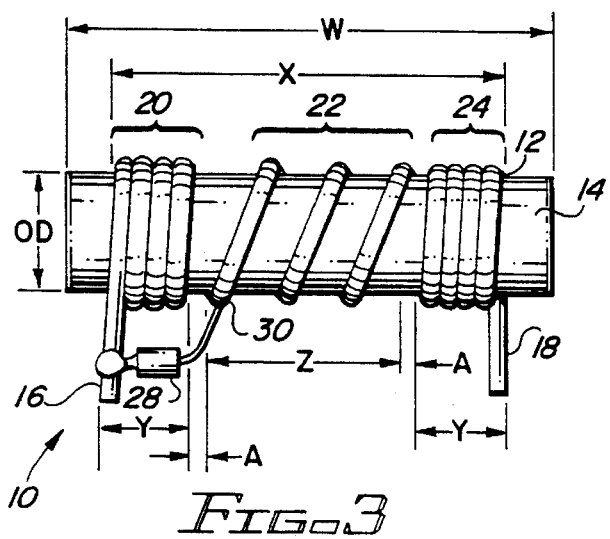
FIG. 3 is a front view of the RF choke shown in FIG. 1.
Figure 4:
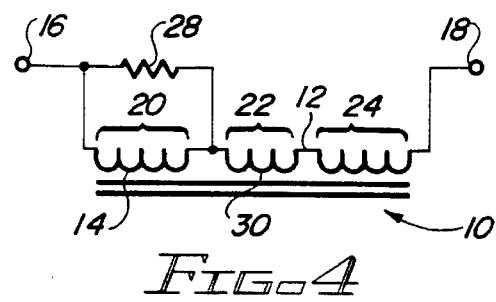
FIG. 4 is a schematic diagram of the RF choke shown in FIG. 1.

Referring to FIGS. 1, 3, and 4, there is shown an RF choke 10, having a conductor or wire 12 wound upon cylindrically shaped elongated core 14 of ferrite material. Conductive wire 12 having a suitable gage (preferably a magnetic and polyurethane insulated 20 AWG wire type, although 16–24 AWG wire may be used), has a predetermined thickness. One end of the wire will be referred to as the input lead 16 and the other end of the wire will be referred to as the output lead 18.

The RF signals and the AC power signals are transmitted onto the input lead 16 and exit RF choke 10 at output lead 18. The wire 12 is wound around the core a predetermined number of turns. Preferably the wire is wound eleven times to form a first winding group 20 of four abutting windings, then wound into a second winding group 22 of three spaced apart windings and a third winding group 24 of four abutting windings. It is critical that the first and third winding groups 20 and 24 have the same number of windings.

A resistor 28 having a preselected value is connected between the input lead 16 and a first turn 30 of the wire 12 in the second winding group 22. Resistor 28 preferably ranges in value between 325 ohms and 1490 ohms, with the preferred resistor value being 620 ohms, plus or minus five percent, and has an ⅛ watt power rating.

As is shown, cable transmission and distribution systems vary in bandwidth of the RF signals and AC current carrying capacity. Such systems will affect the choke configuration. Thus, the following description is presented for completeness and is intended as an example and not as a limitation of the present invention.

Referring to FIG. 3, the length of core 14, its outer diameter, as well as the distances between the wire 12 and their associated spacing, shown in FIG. 3, is specified in the following Table 1:

TABLE 1

| | AH Dimensions in Millimeters | | |
|---|---|---|---|
| Location | Minimum | Maximum | Preferred |
| W: | 12.0 | – | 19.08 |
| X: | 11.938 | – | 18.034 | 14.5 |
| Y: | 3.556 | – | 5.08 | 3.73 |
| Z: | 3.556 | – | 6.35 | 4.29 |
| A: | 0.762 | – | 2.03 | 1.37 |
| OD: | 3.80 | – | 9.10 | 4.69 |

Preferably wire 12 is a twenty AWG magnetic wire made with a polyurethane coating that complies with J-W-1177/9 Specifications. The outer diameter of the 12 wire is typically 0.0320 inches (0.8128 mm). Core material 14 may be of any suitable ferro magnetic material. However, the preferable ferrite material is F-14 type distributed by Neosid of Eatontown, N.J.

Figure 2:
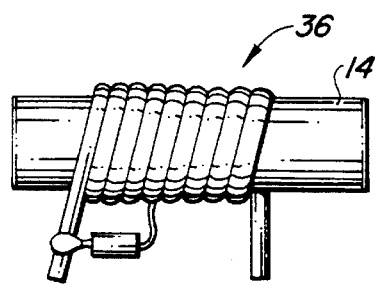
FIG. 2 is a front view of the prior art RF choke.
Figure 5:
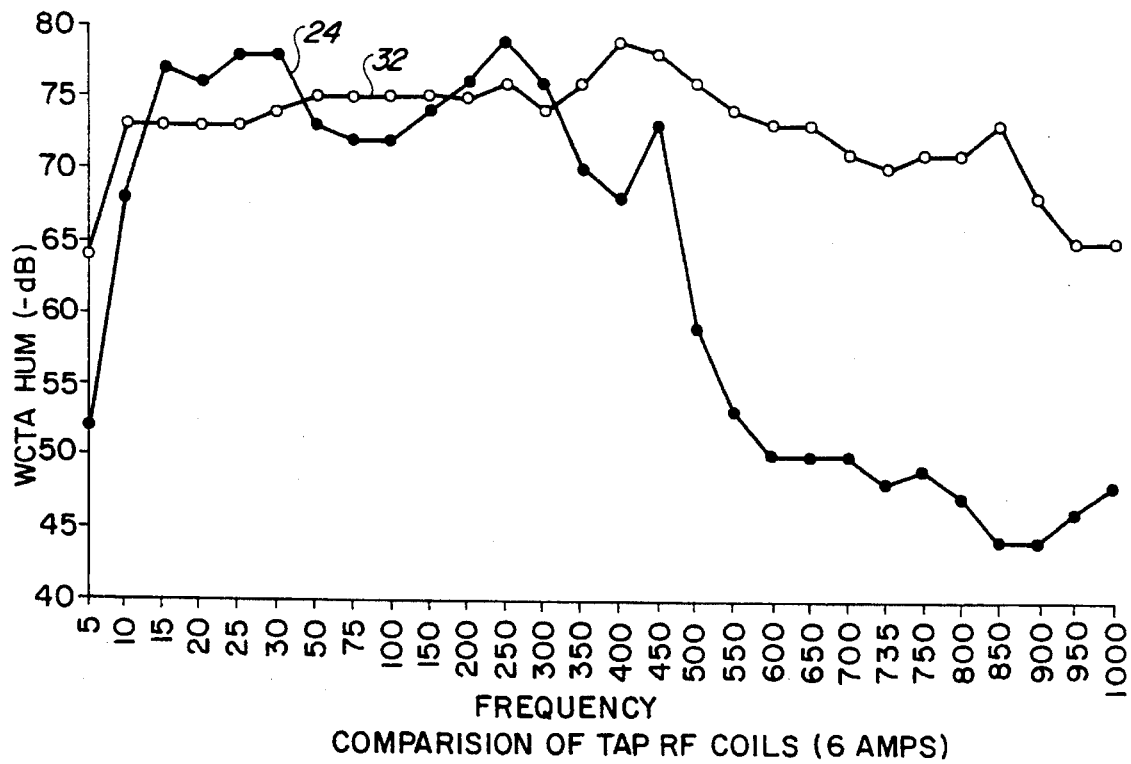
FIG. 5 is a graph of a comparison between the Hum modulation vs. frequency of the RF choke shown in FIG. 1 with the prior art RF choke shown in FIG. 2.

Referring to FIG. 5, there is shown a comparison of the NCTA defined hum rood between the RF choke 10 in accordance with the invention (line 32) and the prior art RF choke 36 as shown in FIG. 2 (line 24). A system was set up to test the RF chokes by varying the frequency of an RF signal through the choke from 5 MHz to 1 GHz while running 6 amps of 60 Hz AC current. Setups for measuring hum mod are generally known in the art. An example of this setup is described in "NCTA Recommended Practices for Measurements on Cable Television Survey", published in 1983 by National Cable Television Association which is hereby incorporated by reference.

Referring to FIG. 5, it is noted that at frequencies above 450 MHz, the hum mod distortion of the RF signal passing through choke 10 increases greatly with frequency. With RF choke 10 the hum mod distortion is significantly less than that of choke 36 in the same frequency band.

Figure 6B:
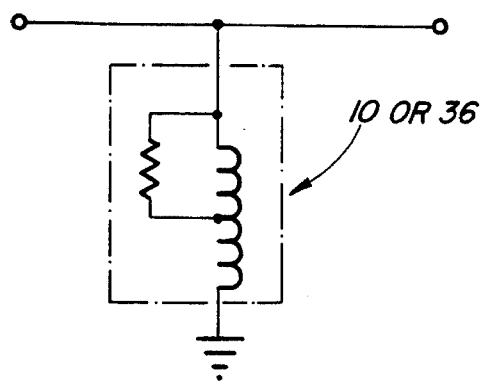
FIG. 6B is a schematic diagram of the RF choke test setup to measure the insertion loss as illustrated in FIG. 6A.
Figure 6A:
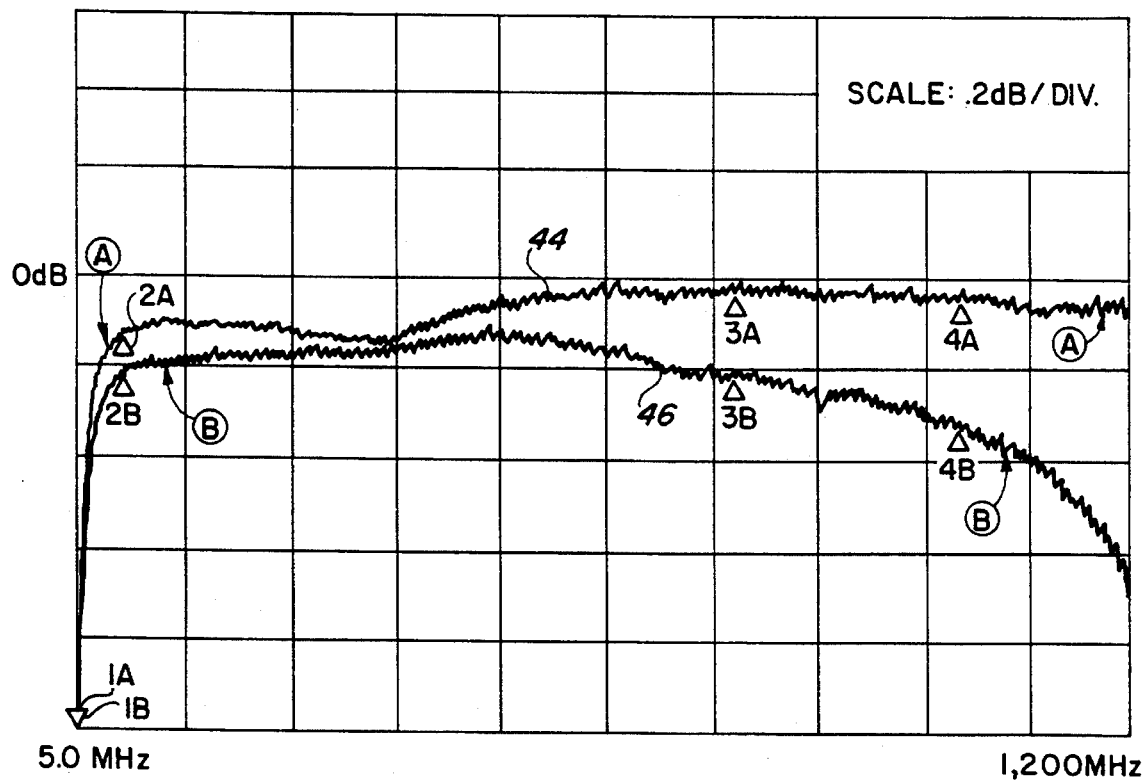
FIG. 6A is a graph of a comparison between the insertion loss of the choke shown in FIG. 1 with the prior art RF choke shown in FIG. 2, using the test setup shown in FIG. 6B.

Referring to FIG. 6A, there is shown a comparison of the amount of energy that is shunt to ground through either choke 10 or choke 36 when RF energy is injected into input 40 shown in FIG. 6B and measured at output 42. A plot of the insertion loss characteristics was taken using choke 10 and choke 36. The RF energy at output 42 is measured using choke 10, shown by line 44, and a plot of the insertion loss characteristics using RF choke 36 is shown by line 46. The following Table 2 lists the insertion loss of both RF choke 10 and RF choke 36 at various sample frequencies. It is recognized that the insertion loss characteristics of RF choke 10 are improved over RF choke 36.

TABLE 2

| Choke 10 Data Point | Frequency | Insertion Loss | Choke 36 Data Point | Insertion Loss |
|---|---|---|---|---|
| 1a | 5 Mhz | −1.6898 dB | 1b | −2.3389 dB |
| 2a | 55 MHz | −.1312 dB | 2b | −.2054 dB |
| 3a | 750 MHz | −.0314 dB | 3b | −.1819 dB |
| 4a | 1 GHz | −.0598 dB | 4b | −.3416 dB |

The specific details presented above provide the RF choke with characteristics ideally suited for frequency diplexing circuits for CATV distribution equipment. However, exactly what occurs in the RF choke is unknown.

Referring to FIG. 7, there is shown an example tap 48 having a coupler 58 coupled in parallel with choke 10. Choke 10 passes RF signals and AC power signals from input terminal 50 to output terminal 52 that are carried on the same conductor.

Coupler 58 is coupled to input terminal 50 and output terminal 52 through capacitor 54 and capacitor 56 respectively. Capacitors 54 and 56 block the AC signal on input terminal 50 and output terminal 52. Coupler 58 includes primary winding 62 and secondary winding 64, each having a predetermined number of windings. Coupler 58 has a grounded center tap 66. Primary winding 62 is operative to pass the RF signals on input terminal 50 to output terminal 52, and also couples the RF signals to secondary winding 64. One end of secondary winding 64 is connected in parallel through capacitor 68 and resistor 70 to ground. The other end of secondary winding 64 is grounded through capacitor 72 and capacitor 74. The junction of capacitors 72 and 74 is connected to splitter 76.

Splitter 76 includes a primary winding 78 and secondary winding 80, each having a center tap 82 grounded through capacitor 84. One end of primary winding 78 is connected to capacitors 72 and 74 junction, and the other end is grounded. The secondary winding 80 of splitter 76 has a first terminal 83 connected to splitter 88, and a second terminal 85 connected to splitter 90. Connected in series between terminals 83 and 85 are capacitor 92, resistor 94 and capacitor 96. Splitters 88 and 90 have primary terminals 98 and 100, secondary terminals 102 and 104, and center taps 106 and 108, which are respectively coupled through capacitors 110 and 112 to ground. Splitters 88 and 90 couple signals fed to their primary windings 98 and 100 to their secondary windings 102 and 104 respectively. Splitter 88 has output terminals 110 and 112 connected to the secondary winding. Splitter 90 has output terminals 114 and 116 also connected to its secondary winding. Capacitor 118 and resistor 120 are connected in series between terminals 110 and 112. Capacitor 122 and resistor 124 are connected in series between terminal 114 and terminal 116. Taps 130, 132, 134, 136 are respectively connected to terminals 110, 112, 114 and 116.

Although RF choke 10 is used in tap 48, choke 10 has other applications in amplifiers and line extenders for cable television systems. Although a four tap circuit is shown containing choke 10 in FIG. 7, choke 10 is applicable to other tap configurations such as two tap, eight tap, sixteen tap, configurations. Preferably choke 10 uses a ferrite core; however, choke 10 may include other core types such as tubular sleeves with a tuning spark or air coils.

While the principles of the invention have been made clear in the illustrated embodiments, there will be immediately obvious to those skilled in the art, many modifications are structured arrangements proportions, elements, materials, and components used in the practice of the invention, in otherwise which are particularly adapted for specific environments and operational requirements, without departing from those principals. The appended claims are therefore intended to cover and embrace any such modifications within the limits only of the true spirit and scope of the invention.

What is claimed is:

1. A Radio Frequency Choke comprising:

an elongated core material;

a conductor wound upon said core material and having a first lead and a second lead, said conductor having a first, second and third successive winding group disposed between said first and said second lead, each winding group having a plurality of windings wound on said core material in series with one another, said first winding group having the same number of windings as the third winding group; and said winding groups having a spacing between a last turn of one winding group and a first turn of an adjacent winding group; and a resistor connected between one of the windings in said first winding group and one of said windings in said second winding group.

2. The choke as recited in claim 1 wherein both the spacing between the windings of the first winding group and the second winding group, and the spacing between the windings of the second winding group and the third winding group is greater than the thickness of the conductor.

3. The choke as recited in claim 1 wherein said first winding group has 4 windings and said third winding group has 4 windings.

4. The choke as recited in claim 3 wherein the second winding group has 3 windings.

5. The choke as recited in claim 1 wherein successive windings of the second winding group have a spacing therebetween with a distance greater than the spacing between the windings of either the first winding group or the third winding group.

6. A Radio Frequency Choke comprising:

an elongated core material;

a conductor wound upon said core material and having a first lead and a second lead, said conductor having a first, second and third successive winding group disposed between said first and said second lead, each winding group having a plurality of windings wound on said core material in series with one another, said first winding group having the same number of windings as the third winding group;

said winding groups having a spacing between a last turn of one winding group and a first turn of an adjacent winding group; and a resistor connected between said first lead and the first turn of said second winding group.

7. The choke as recited in claim 6 wherein the resistor has a value of between 325 and 1490 ohms.

8. A Radio Frequency Choke comprising:

an elongated core of ferrite material;

a wire having a predetermined thickness and having an input lead and an output lead, said wire having a first, second and third successive winding group disposed between said input and said output lead, each winding group having a plurality of windings wound on core material in series with one another, said first and third winding group each having windings touching each other and said second winding group having windings spaced apart from each other;

said winding groups having a spacing greater than the predetermined thickness and disposed between a last turn of one winding group and a first turn of an adjacent winding group; and a resistor connected between said first input lead and the first turn of said second winding group.

9. The choke as recited in claim 8 wherein the value of the resistor ranges from 325 ohms to 1490 ohms.

10. The choke as recited in claim 8 wherein the value of the resistor is about 620 ohms.

11. The choke as recited in claim 8 wherein the wire is about 20 AWG, and the spacing between the first and second winding group, and between the second and third winding group is between about 0.762 and 2.03 mm.

12. The choke as recited in claim 11 wherein the length of the core is between about 12.0 and 35.0 mm, and wherein the core is substantially cylindrically shaped having an outer diameter of between about 3.8 and 9.1 mm.

13. An RF tap having an input terminal, an output terminal and a plurality of tap terminals, wherein the tap is operative to pass from the input terminal to the output terminal an RF signal and a AC power signal carded on a same conductor, and wherein the tap couples the RF signal to the tap terminals, the tap comprising:

a coupler having a primary winding and a secondary winding wherein signals fed to the primary winding are coupled to the secondary winding, said primary winding being capacitively coupled to the input and output terminal and operative to pass the RF portion of the signal from the input to the output terminal;

a splitter having a primary winding capacitively coupled to the coupler secondary winding and having a secondary winding coupled to the tap terminals wherein signals fed to the splitter primary winding are coupled to the splitter secondary winding; and a radio frequency choke coupled to said input and output terminal in parallel with said coupler and operative to pass the AC power signal and prevent the passages of the RF signal between the input and output terminal, the choke comprising:

(a) an elongated core of ferrite material;

(b) a conductor wound upon said core material and having a first lead connected to the input terminal and a second lead connected to the output terminal, said conductor having a first, second and third successive winding group disposed between said first and said second lead, each winding group having a plurality of windings wound on said core material in series with one another, said first and third winding group each having windings touching each other and said second winding group having windings spaced apart from each other;

(c) said winding groups having a spacing between a last turn of one winding group and a first turn of an adjacent winding group; and (d) a resistor connected between said first lead and the first turn of said second winding group.

14. The RF Tap as recited in claim 13 wherein said successive windings of the second winding group have a spacing therebetween with a distance greater than the spacing between the windings of either the first winding group or the winding group.

15. The RF Tap as recited in claim 13 wherein said first winding group has the same number of windings as the third winding group.

16. The RF Tap as recited in claim 13 wherein said winding groups have a spacing from each other greater than a thickness of the conductor and said spacing is disposed between a last turn of one winding group and a first turn of an adjacent winding group.

17. The RF Tap as recited in claim 13 wherein said first and third winding group each have 4 windings touching each other and said second winding group has 3 windings spaced apart from each other.

\* \* \* \* \*